United States Patent
Schnatwinkel et al.

(10) Patent No.: US 6,575,771 B2
(45) Date of Patent: Jun. 10, 2003

(54) ELECTRICAL APPARATUS INCLUDING A BUS CONDUCTOR SECTION

(75) Inventors: Michael Schnatwinkel, Herford (DE); Walter Hanning, Detmold (DE)

(73) Assignee: Weidmuller Interface GmbH & Co., Detmold (DE)

( * ) Notice: Subject to any disclaimer, the term of this patent is extended or adjusted under 35 U.S.C. 154(b) by 0 days.

(21) Appl. No.: 10/084,887

(22) Filed: Mar. 1, 2002

(65) Prior Publication Data

US 2002/0127895 A1 Sep. 12, 2002

(30) Foreign Application Priority Data

Mar. 7, 2001 (DE) .................................. 201 03 978 U

(51) Int. Cl.⁷ .............................................. H01R 12/00
(52) U.S. Cl. ..................................... 439/76.1; 439/716
(58) Field of Search ............................... 439/76.1, 712, 439/715, 716, 717, 94, 121, 709

(56) References Cited

U.S. PATENT DOCUMENTS

| | | | |
|---|---|---|---|
| 5,615,079 A | 3/1997 | Eggert et al. | ............... 361/637 |
| 5,722,862 A | 3/1998 | Glathe et al. | ............... 439/709 |
| 6,241,561 B1 | 6/2001 | Zebermann et al. | ........ 439/716 |

FOREIGN PATENT DOCUMENTS

| | | |
|---|---|---|
| DE | 36 33 785 A1 | 4/1988 |
| DE | 41 40 611 C1 | 5/1993 |
| DE | 297 13 960 U1 | 1/1998 |
| DE | 197 48 530 C1 | 2/1999 |
| DE | 197 48 429 A1 | 5/1999 |
| DE | 198 07 710 A1 | 9/1999 |
| DE | 198 38 493 C1 | 5/2000 |
| DE | 199 02 745 A1 | 8/2000 |
| DE | 296 24 219 U1 | 4/2001 |
| EP | 1 079 465 A2 | 2/2001 |

*Primary Examiner*—P. Austin Bradley
*Assistant Examiner*—Ross Gushi
(74) *Attorney, Agent, or Firm*—Lawrence S. Laubscher, Sr.

(57) ABSTRACT

A terminal block assembly is provided for use in the electrical power supply and/or monitoring signal control bus section of an automated industrial, commercial or residential building, characterized by the provisions of a terminal block containing a first opening for receiving a printed circuit board, and a second opening for removably receiving a replaceable internal bus conductor unit. The bus conductor unit carries first conductors arranged on a thin insulating support plate for connection with the power supply bus and/or the signal voltage lines of the electrical monitoring and/or control system, and second conductors arranged on the support plate for connection with the circuits of the printed circuit board. Jumper connections are provided for connecting selected first and second conductors with each other.

9 Claims, 5 Drawing Sheets

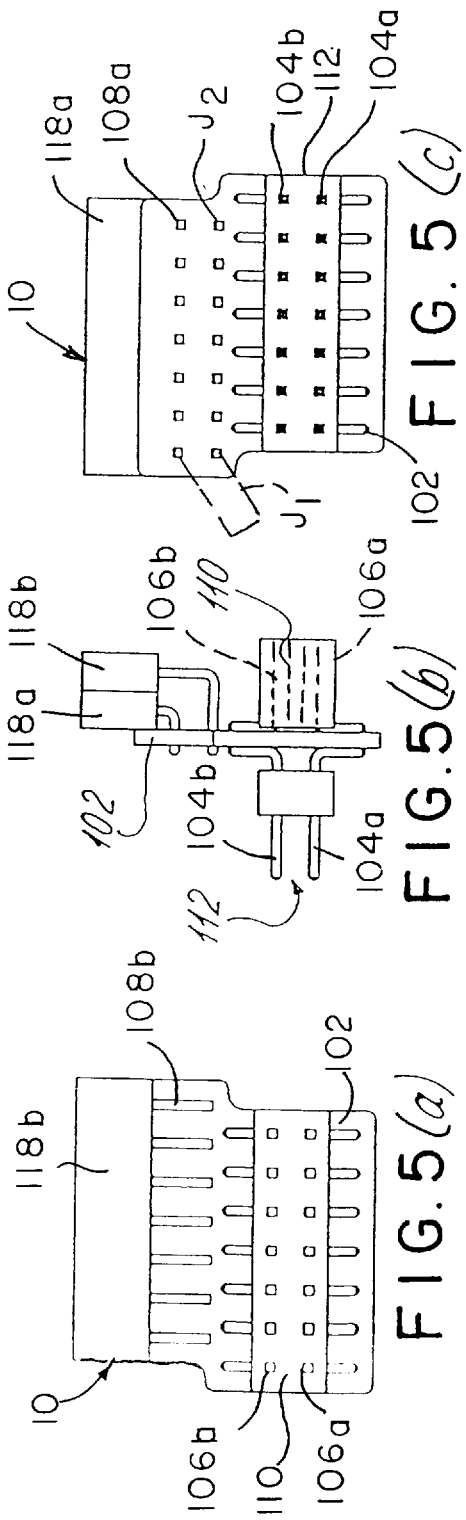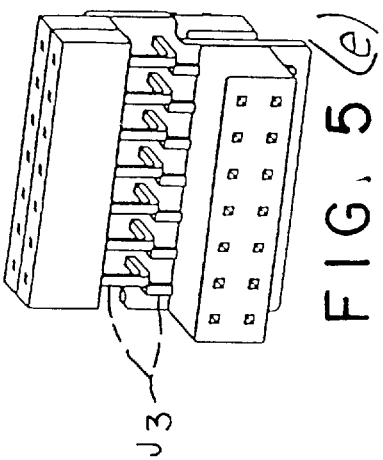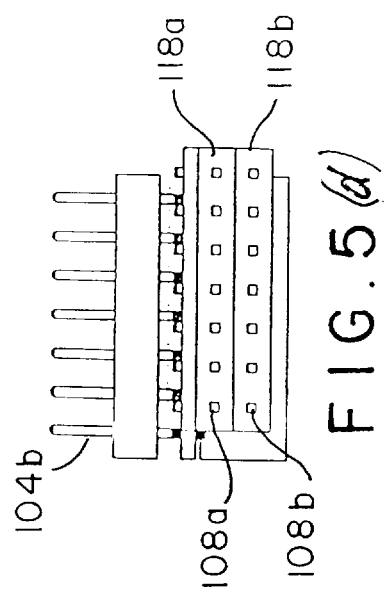

ELECTRICAL APPARATUS INCLUDING A BUS CONDUCTOR SECTION

SPECIFICATION

Field of the Invention

A terminal block assembly includes a terminal block containing a first opening for receiving a printed circuit board, and a second opening for removably receiving an internal bus connector unit. The bus connector unit comprises a thin flat support plate that carries first conductor means arranged for connection with the power supply and monitoring signal conductors of the distribution system, and second conductor means arranged for connection with the electrical circuits on the printed circuit board.

BACKGROUND OF THE INVENTION

Brief Description of the Prior Art

Modular control systems for automated commercial, industrial, and residential buildings are disclosed in the prior patents to Eggert, et al., U.S. Pat. No. 5,615,079 and Glathe, et al., Pat. No. 5,722,862, both assigned to the instant Applicant. The use of interconnecting terminal block devices for such distribution systems is shown in the Zebermann, et al., U.S. Pat. No. 6,241,561, among others.

A bus conductor section for electrical equipment is known from the European patent No. EP 95 113 729 A2. The equipment, shown in this publication as the internal bus conductor section, is made as a continuous thin plate with strip conductors applied thereupon, In this equipment, terminal blocks that can be lined up next to each other on supporting rails are used for signal adaptation between a super-ordinate field bus and initiators, field units or the like that are connected to the connection blocks. The terminal blocks are made up of functionally different connection or module discs, such as protective conductor discs, feed discs, supply/signal conductor discs and catch foot discs. One or more connection blocks can be connected via the internal bus conductor with a connection module for the field bus.

Another bus conductor section is known from the European patent No. EP 00 100 303, wherein the bus conductor sections of the individual base terminal carriers are made structurally separate from each other, each having a thin plate through which passes at least one row of metal pins which are aligned on one side of the thin plate generally normal to the plate, and on the opposite side, essentially parallel to the thin plate, whereby the row of pins extending orthogonally relative to the thin plate is so dimensioned that its pin row ends can be used directly for contacting a socket terminal strip. The structural separation of the bus conductor sections of each module disc first of all offers the advantage of an almost random ability to line up also the bus conductor section with each other and thus enhances the versatility of the entire module system. Moreover, the chosen structural design of the bus conductor section with a thin plate and with angle pins of special length passing through the thin plate will offer the advantage of being able to omit the separate plug elements for contacting a separate equipment plug or an equipment plug molded upon an electronic printed circuit board.

Although the solution offered in the aforementioned European patent No. EP 00 100 303 proved effective, there is nevertheless the need for an optimization of the electrical equipment and its internal bus conductor for special cases of practical use in which a relatively large number of data and/or supply lines are provided in a very tight space. The object of this invention is to solve this problem.

SUMMARY OF THE INVENTION

Accordingly, a primary object of the present invention is to provide a generally rectangular terminal block containing a first opening for receiving a printed circuit board, and a second opening for removably receiving a replaceable internal bus connector unit carrying first conductor means adapted for connection with the voltage supply and monitoring and control signal lines of the system, and second conductor means adapted for connection with the electrical circuits of the printed circuit board.

According to a more specific object of the invention, the internal bus connector unit includes a thin support plate that is removably connected with the terminal block that carries the printed circuit board, the terminal block, together with the printed circuit board thereon, being transversely mounted on a support rail. First conductors on the thin support plate of one terminal block are adapted for connection with corresponding first conductors carried by an internal bus connector unit on an adjacent terminal block assembly arranged on the mounting rail.

According to another object of the invention, the first and second conductors carried by the thin support plate of the internal bus connector unit are arranged in superimposed rows of terminal strips, with the conductors being staggered to provide a large number of circuit connections. According to another feature of the invention, the terminal strips carrying the second conductors are vertically arranged in horizontal rows. In one embodiment, it has been proposed to mount one terminal strip row on the bottom edge of the printed circuit board. Thus, a large number of pins and conductors may be provided in an extremely simple manner, offering customer-tailored versatility (regarding the number of poles, shuntability, cross-connections, or the like).

In this way, this solution can also do justice to the most problematical individual cases of practical use with a need for a plurality of bus conductor data lines. Furthermore, along with the signal and supply line arrangement for the electronic printed circuit boards, one can also supply the field units via the internal bus conductor. Compatibility to the module bus technique of the aforementioned European patent No. EP 00 100 303 can also be achieved here.

It is also possible in a simple manner to combine in several rows of connections various types of connections such as light transmitting conductor connections and metallic conductor with each other. Electronic means may be provided for the transmission of light on the printed circuit board in this case.

The fact that the connections can be lined up in many rows also makes it possible to vary the contact sizes without any problems. With the help of different contact sizes, one can adapt the bus conductor in this fashion without any problems to various current load capacity requirements. The soldering connections can be made in any desired fashion, for example, in a through-contacting manner and/or via the SMD [surface-mounted device] technology. One can also insert pole connectors in place of the socket terminal strips and pin strips.

BRIEF DESCRIPTION OF THE DRAWINGS

Other objects and advantages of the invention will become apparent from a study of the following specification when viewed in the light of the accompanying drawings, in which:

FIGS. 5a–5e are front elevation, left side, rear elevation, top and front perspective views of the internal bus connector unit, respectively.

DETAILED DESCRIPTION

Figure 1:
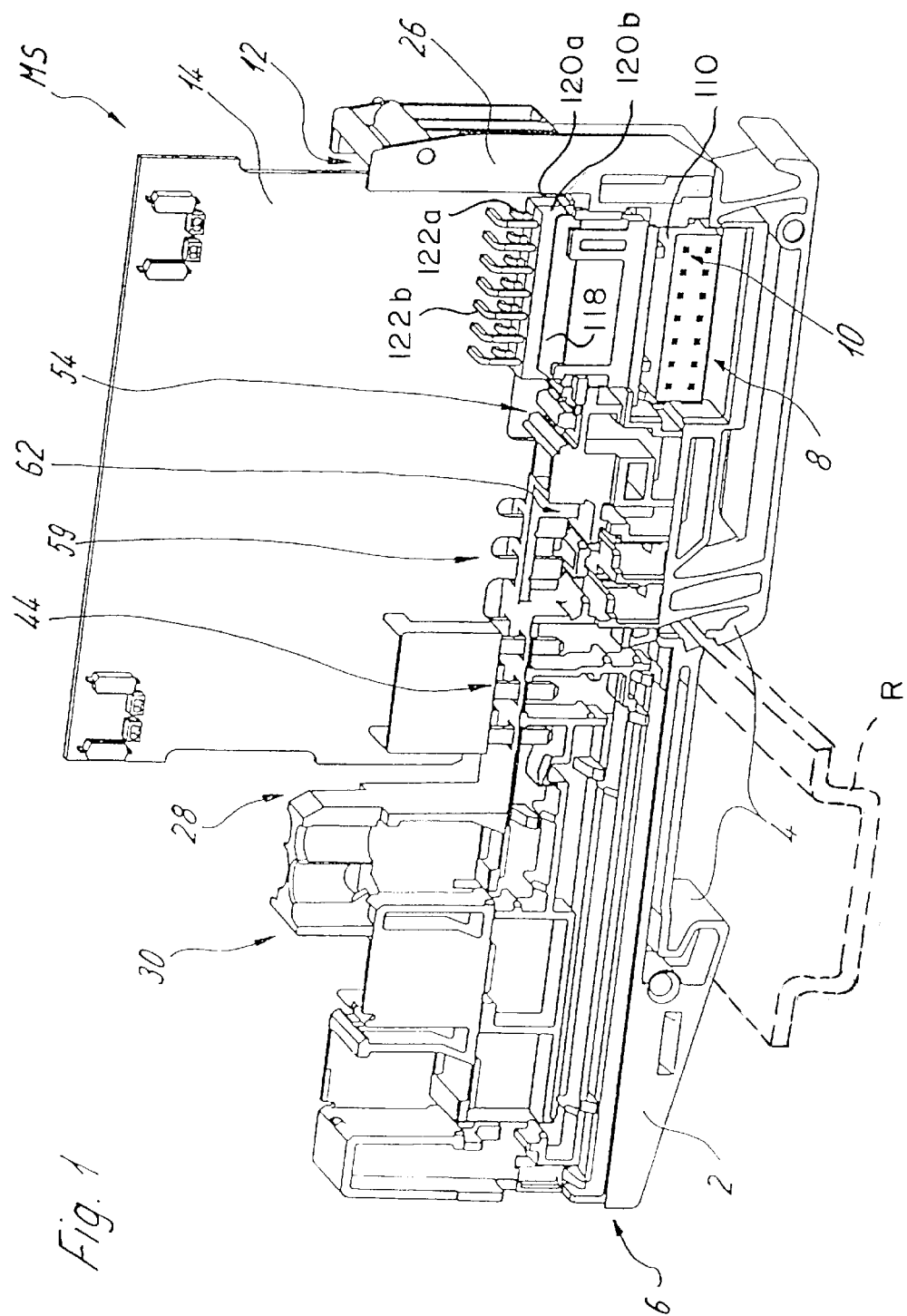
FIG. 1 is a front perspective view of the terminal block assembly of the present invention.

Referring first more particularly to FIG. 1, the terminal block assembly includes a generally rectangular vertically arranged terminal block 2 that is formed of a suitable electrically-insulating synthetic plastic material. The bottom edge portion 6 of the terminal block contains a recess 3 defined between the spaced catch feet 4 by means of which a terminal block is transversely mounted on a mounting rail R, as is known in the art. In accordance with a characterizing feature of the invention, the terminal block 2 contains an opening 8 for receiving an internal bus conductor unit 10, as will be described in greater detail below. The upper portion of the terminal block contains a recess 12 that receives a vertically arranged printed circuit board 14 having electrical circuits thereon. The terminal bus conductor unit 10 includes contacts arranged for connection with the power supply conductors and the monitoring and control signal voltages that are present in the system for automated control of a commercial, residential, or industrial installation. The circuit board 14 is provided with electronic circuitry for processing and relaying the signals that are to be supplied to and from the printed circuit board. The bridge portion 26 of the terminal block contains a groove 28 for receiving the housing of electronic equipment, not shown. The terminal block 2 further includes, in addition to the bus conductor opening 8, a marking groove 54 for receiving one or two labels, openings 59 for receiving portions of the printed circuit board 14, and openings 44 for receiving the stabilizing jacks of the printed circuit board. A further recess 62 is provided for receiving coding elements.

Figure 2:
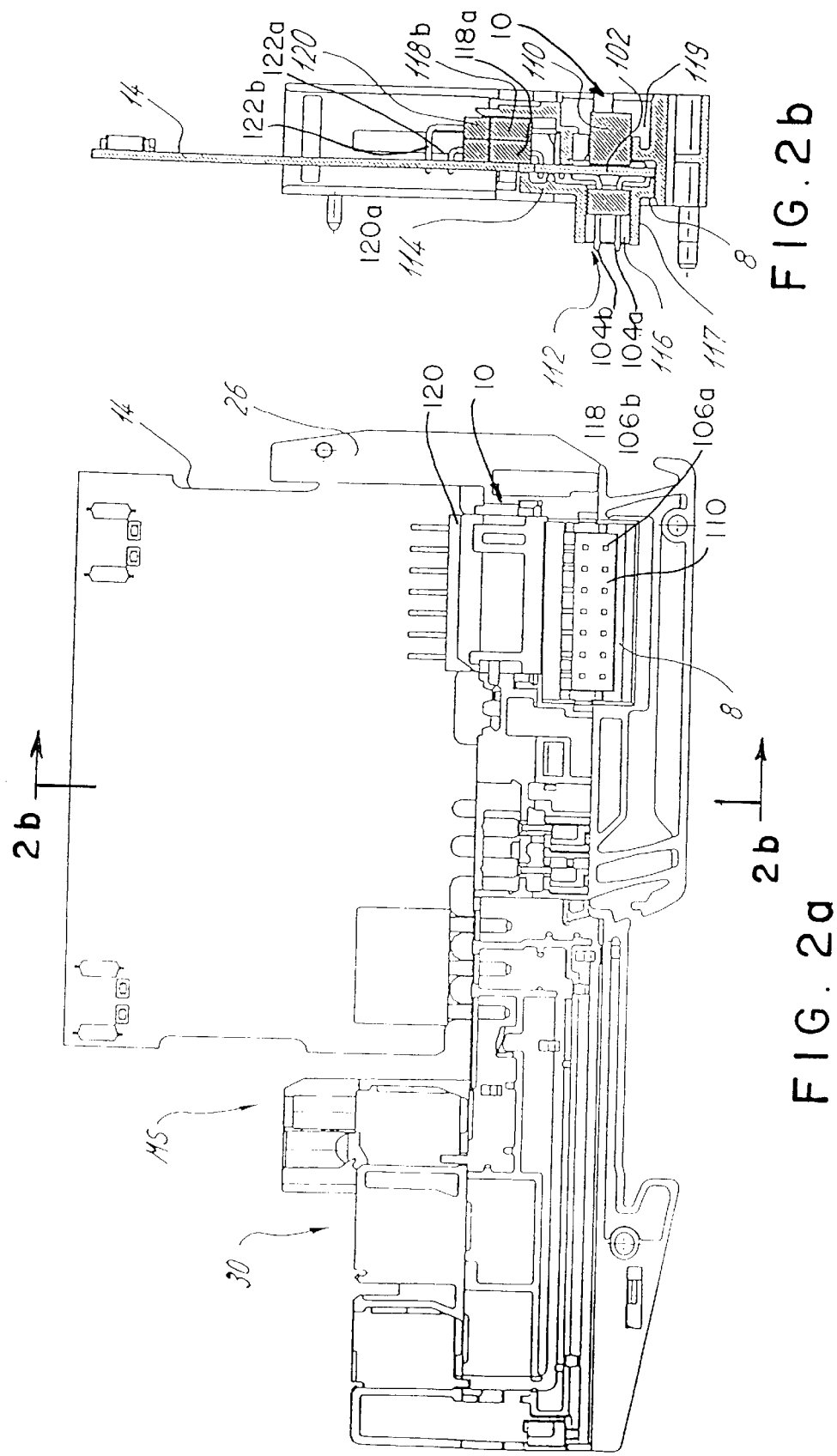
FIG. 2a is a front elevation view of the terminal block assembly of FIG. 1.
FIG. 2b is a sectional view taken along line 2b–2b of FIG. 1.
Figure 3:
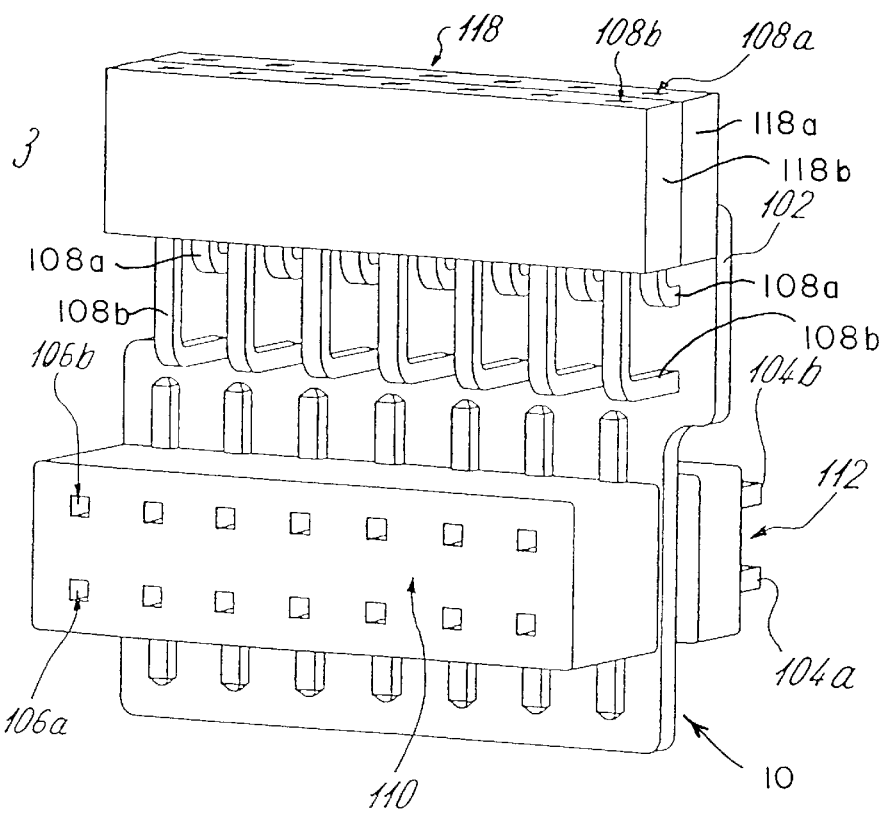
FIGS. 3 and 4 are front perspective views of the internal bus connector unit of the present invention.
Figure 4:
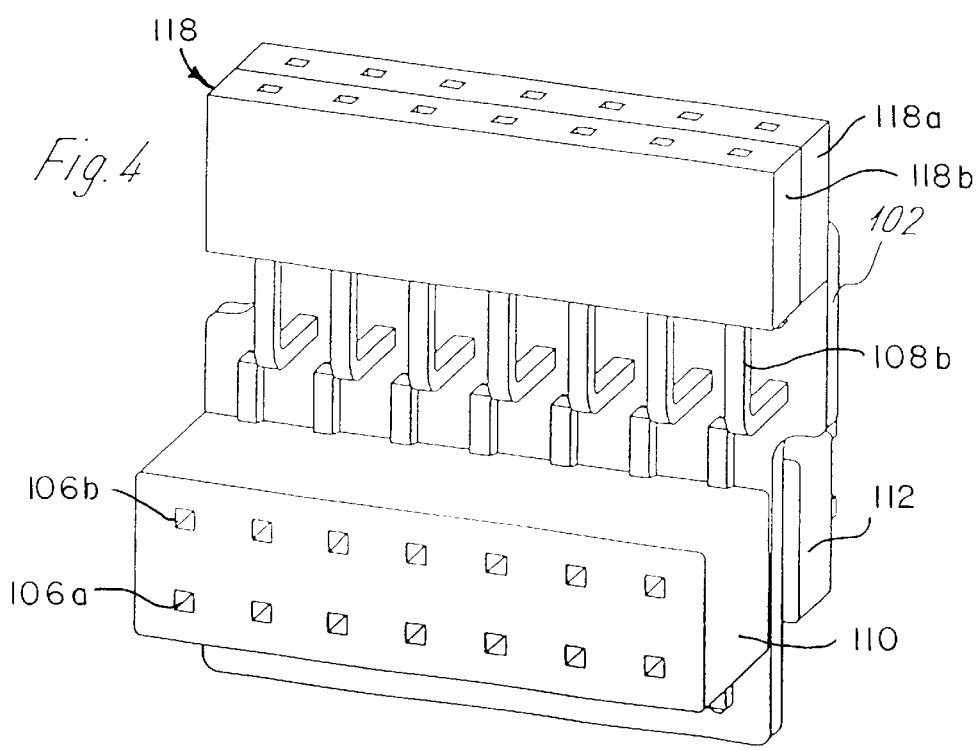

Referring now to FIGS. 2a and 2b, the bus conductor opening 8 receives the bus conductor unit 10 shown more particularly in FIGS. 5a–5e. The bus conductor connecting unit 10 includes a vertical support plate 102 that comprises a suitable non-conductive plate formed of insulation material. On one side, the support plate 102 is provided with a male terminal strip 112 having rows of male contacts 104a and 104b. On its other side, the thin support plate 102 carries a female terminal strip 110 which contains rows of female contacts 106a and 106b aligned with the male contacts 104a and 104b, respectively. These contacts 104a, 104b, 106a, and 106b are arranged for connection in the distribution bus portion of the system that carries the power supply voltages as well as the monitoring and control signal voltages of the automated system. The front face of the support plate 102 also carries a second set of conductors 108a and 108b that are associated with terminal strips 118a and 118b, which are mounted in side-by-side relation as shown in FIG. 5b. The conductors 108a and 108b are vertically spaced to afford maximum number of contacts within a very limited space.

Figure 6:
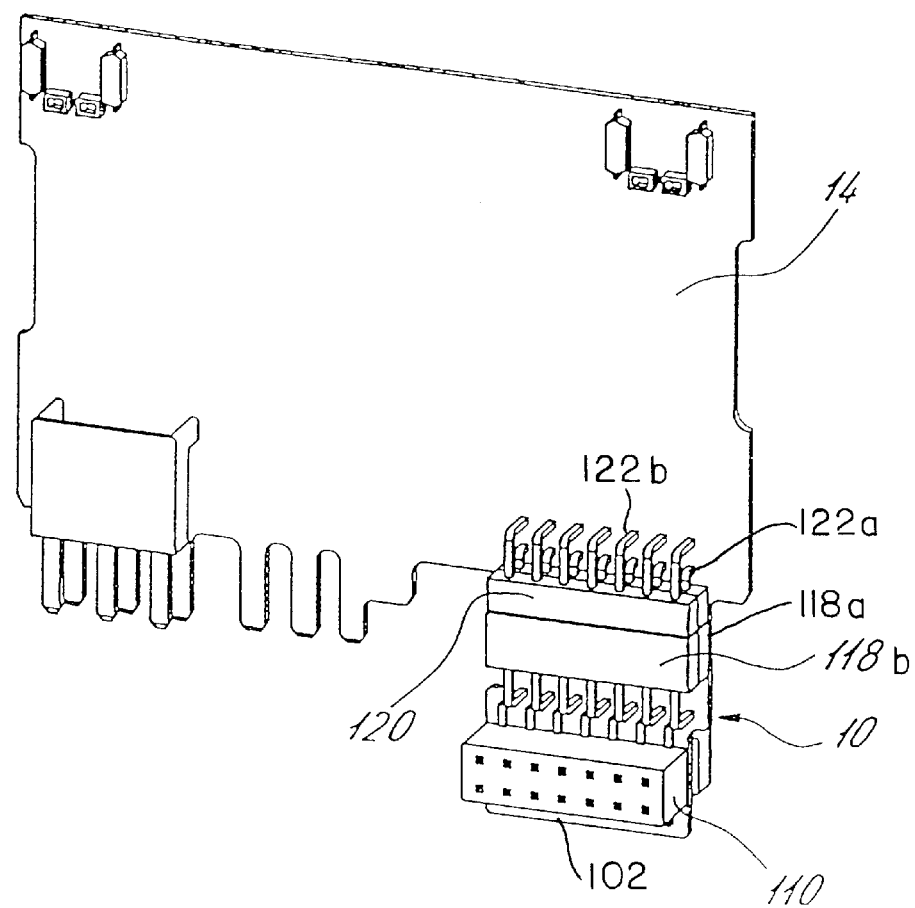
FIG. 6 is a front perspective view of the printed circuit board with the internal bus connection unit connected thereto.

Referring to FIG. 6, it will be seen that the terminal strips 118a and 118b are adapted for connection with terminal strips 120a and 120b, respectively, that are supported by the bottom edge of the printed circuit board 14. The terminal strips are provided with two sets of conductors 122a and 122b that are connected with various circuits of the printed circuit board, respectively. In order to effect connection between the first conductors 104a, 104b and 106a, 106b with the second set of conductors 108a and 108b, selected jumper connections J1 and J2 (FIG. 5c) are provided as desired. These jumper connections may be provided on the internal bus connector unit 10 prior to assembly of the unit with the terminal block 2, if desired.

It will be noted that the thin plate 102 is generally parallel with the electronic printed circuit board of the connection module. Essentially, it is positioned in the plane of the electronic printed circuit board 14 along the latter's main axis and directly adjoins and is contiguous with the electronic printed circuit board 14, as shown in FIG. 2b.

The connections of the internal bus conductor leading to neighboring module discs are formed by a double-row terminal strip 110 and a double-row terminal strip 112 where, in case of adjoining base terminal carriers 2, the terminal strip 112 engages the terminal strip 110 of bus conductor section 10 of the particular neighboring base terminal block 2. Pole connectors can also be put in to take the place of socket terminal strips and pin strips.

This double-row arrangement can also be implemented by a single pole connector if there is no need for any adjustment of single and/or supply lines.

As one can furthermore see in FIG. 2b, thin plate 102 can be inserted in opening 8 of base terminal carrier 2, which opening can be covered by a cover member 114 which, in turn, contains an opening 116 for the at least two superposed rows of connections to the neighboring module disc, together with a guide means 117 that engages a corresponding recess 119 of the adjacent terminal block mounted on the mounting rail R.

A double-row terminal strip means 118 includes a pair of laterally stacked terminal strips 118a and 118b. This double-row terminal strip is used for contacting a likewise double-row terminal strip 120 on electronic printed circuit board 14. This arrangement should be construed in a purely exemplary manner and can also be done in reverse (i.e., by providing the terminal strip on thin plate 102).

If only seven contacts are needed to the electronic printed circuit board 14, then one might also visualize a single-row-contact strip, something that naturally is particularly cheap.

Furthermore, as an alternative, one can also provide one contact strip on each side of the electronic printed circuit board 14.

According to a further alternative, connections 108 to relay the bus conductor signals and/or bus conductor supply voltages between the internal bus conductor 10 and the printed circuit board 102 only represent contact surfaces as strip conductors along the edge of the electronic printed circuit board 14 and are connected via a printed circuit board edge connector on the electronic printed circuit board 14.

In case of a combination of a module disc with a terminal block, it is possible—at least in the area of the first module disc of the module block—to connect a contact of the internal bus conductor in the manner of the first module disc and the additional module disco of the block via a flat-positioned printed circuit board, for example, in the manner of German patent No. DE 44 38 801.

While in accordance with the provisions of the Patent Statutes the preferred forms and embodiments of the invention have been illustrated and described, it will be apparent to those skilled in the art that various changes may be made without deviating from the inventive concepts set forth above.

What is claimed is:

1. A terminal block assembly adapted for use with an electrical monitoring and control system including internal bus conductor means for supplying signal voltages and power supply voltages, comprising:

(a) a generally rectangular terminal block (2) formed of insulating material, said terminal block having a horizontal longitudinal axis and including a pair of vertical side walls, a pair of vertical end walls, and horizontal top and bottom walls,
      (1) said bottom wall containing a recess (3) for receiving a transversely arranged mounting rail (R);
      (2) said top wall containing a first opening (12);
      (3) said first opening having a bottom wall containing a second opening (8) in communication with said first opening;
   (b) a vertical rectangular printed circuit board (14) arranged parallel with said terminal block, said printed circuit board having a lower edge portion removably mounted in said first opening, said printed circuit board having electrical circuit means thereon; and
   (c) a bus conductor unit (10) removably mounted within said second opening, said bus conductor unit including;
      (1) a vertical thin support plate (102) removably mounted within said second opening said support plate being formed from a non-conductive insulating material and being coplanar with said printed circuit board;
      (2) first conductor means (104a; 106a) mounted on said support plate for connection with the internal bus conductor means of the power supply, monitoring, and control system; and
      (3) second conductor means (108a; 108b) mounted on said plate for connection with the circuit means of the printed circuit board.

2. A terminal block assembly as defined in claim 1, wherein said first and second conductor means are each generally L-shaped include parallel vertical portions that extend parallel with said plate in laterally offset relation relative to each other.

3. A terminal block assembly as defined in claim 1, wherein said thin support plate is in contiguous edge-to-edge engagement with said printed circuit board.

4. A terminal block assembly as defined in claim 1, and further including:
   (d) third conductor means (122a, 122b) mounted on said printed circuit board lower edge for connection with said second conductor means.

5. A terminal block assembly as defined in claim 4, wherein two sets (108a, 108b) of said second conductors are connected with a pair of laterally arranged first terminal strips (118a, 118b), respectively; and further wherein two sets (122a, 122b) of said third conductors are connected with a corresponding pair of laterally arranged second terminal strips (120a, 120b), respectively.

6. A terminal block assembly adapted for use with an electrical monitoring and control system including internal bus conductor means for supplying signal voltages and power supply voltages, comprising:

(a) a generally rectangular terminal block (2) formed of insulating material, said terminal block having a horizontal longitudinal axis and including a pair of vertical side walls, a pair of vertical end walls, and horizontal top and bottom walls,
      (1) said bottom wall containing a recess (3) for receiving a transversely arranged mounting rail (R);
      (2) said top wall containing a first opening (12);
      (3) the bottom wall portion of said first opening containing a second opening (8) in communication with said first opening;
   (b) a vertical rectangular printed circuit board (14) parallel with said terminal block, said printed circuit board having a lower edge portion mounted in said first opening, said printed circuit board having electrical circuit means thereon; and
   (c) a bus conductor unit (10) removably mounted within said second opening, said bus conductor unit including;
      (1) a vertical thin support plate (102) removably mounted within said second opening, said support plate being formed from a non-conductive insulating material and being generally parallel with said printed circuit board;
      (2) first conductor means (104a; 106a) mounted on said support plate for connection with the internal bus conductor means of the power supply, monitoring, and control system, said first conductor means including:
         (a) a plurality of male contacts (104a, 104b) extending orthogonally from one side of said thin support plate; and
         (b) a plurality of corresponding female contacts (106a, 106b) extending orthogonally from the other side of said thin support plate opposite said male contacts respectively, the male contact of one of said bus conductor units in one of said terminal blocks being arranged for electrical engagement with the corresponding female contact of an adjacent bus conductor unit mounted on an adjacent terminal block; and
      (3) second conductor means (108a; 108b) mounted on said plate for connection with the circuit means of the printed circuit board; and
      (4) jumper conductor means (J1, J2, J3) selectively connecting selected ones of said first and said second conductor means.

7. A terminal block assembly as defined in claim 6, wherein some of said first and second conductor means include light-transmitting optical elements.

8. A terminal block assembly as defined in claim 6, and further including a cover member (114) connected with said terminal block to cover said second opening, said cover member containing a through bore (116) affording access to the associated first male conductor contacts (104a, 104b).

9. A terminal block assembly as defined in claim 8, wherein said through bore contains male guide means (117) arranged for cooperation with a corresponding guide recess (119) contained in the adjacent face of an adjacent terminal block mounted on the mounting rail.

* * * * *